United States Patent [19]

Main

[11] Patent Number: 4,728,815
[45] Date of Patent: Mar. 1, 1988

[54] DATA SHAPING CIRCUIT

[75] Inventor: W. Eric Main, Mesa, Ariz.

[73] Assignee: Motorola, Inc., Schaumburg, Ill.

[21] Appl. No.: 919,349

[22] Filed: Oct. 16, 1986

[51] Int. Cl.[4] .......................... H03K 5/00; H03K 5/08; G05F 3/16; H03F 3/45
[52] U.S. Cl. ................................. 307/261; 307/262; 307/268; 328/28; 328/164; 323/315; 330/257
[58] Field of Search ................ 323/315, 316; 330/257, 330/288; 307/261, 362, 268, 360, 262; 328/28, 150, 168, 164, 32

[56] References Cited

U.S. PATENT DOCUMENTS

| | | | |
|---|---|---|---|
| 3,818,356 | 6/1974 | Kinbara | 307/362 |
| 4,536,662 | 8/1985 | Fujii | 330/288 |

FOREIGN PATENT DOCUMENTS

| | | | |
|---|---|---|---|
| 0129589 | 7/1984 | Japan | 328/150 |
| 0374725 | 5/1973 | U.S.S.R. | 307/261 |

OTHER PUBLICATIONS

Schenkel, "Measuring Irregular Waveforms by Detecting Amplitude Changes", Feb. 1982, Electronics.

Primary Examiner—Stanley D. Miller
Assistant Examiner—Trong Quang Phan
Attorney, Agent, or Firm—Michael D. Bingham

[57] ABSTRACT

A circuit for producing output pulses in response to an alternating signal supplied to the input thereof which is comprised of a pair of complementary transistors cascoded between a pair of current mirror circuits which source and sink currents to and from a common terminal respectively. The alternating input signal is applied to the interconnected emitters of the two transistors thereby rendering one more conductive while the other is rendered less conductive and vice versa. The currents which are sourced or sunk at the common terminal are proportional to the currents flowing in the two transistors and are compared to cause an output transistor to switch operating states thereby producing the output pulse.

8 Claims, 4 Drawing Figures

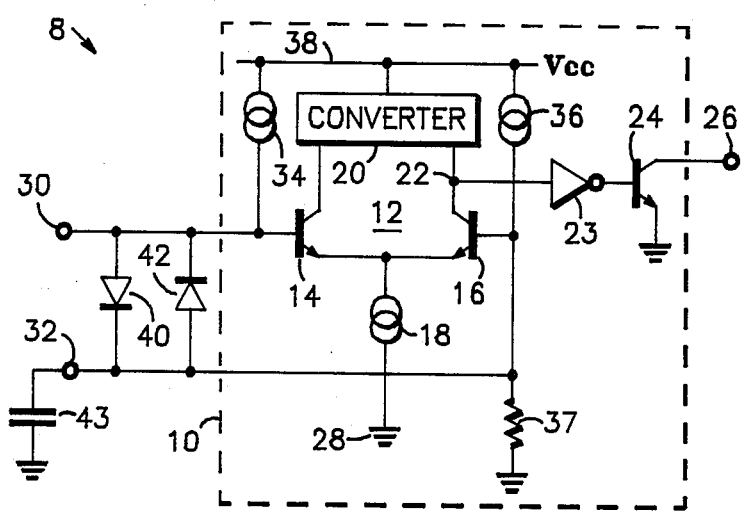
— PRIOR ART —   *FIG. 1*
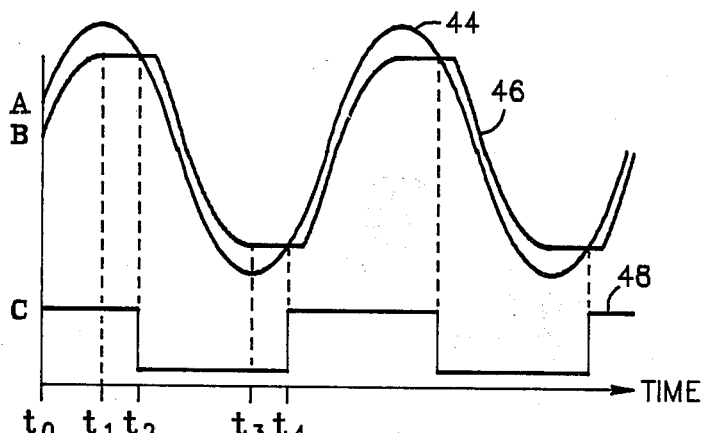
*FIG. 2*

DATA SHAPING CIRCUIT

BACKGROUND OF THE INVENTION

This invention relates generally to high frequency/high gain receivers and, more particularly, to circuitry utilized in such receivers to improve the leading and trailing edges of the received signal.

High frequency/high gain receiver systems are used in myriad of applications. For example, digital data communication equipment typically include a high frequency/high gain frequency shift keying (FSK) receiver. The digital data is received and demodulated as understood.

Sometimes the transmitted digital data can become distorted through intermediate stages of the receiver such that the square wave digital data is shaped more like a sine wave. If this is the case, the data must be reshaped to obtain useful bits of information.

Prior art systems have utilized comparators to square up the data bits. However in some receivers, e.g., FSK receivers, the direct current (DC) level of the data signal can drift away from the reference voltage of the comparator. This can be resolved by alternating current (AC) coupling but then the circuit can no longer handle long strings of bits of one polarity.

This problem was solved in one prior art wideband FSK receiver, the MC3356 receiver manufactured by Motorola Inc., using back to back clamping diodes across the inputs of a "floating" comparator. Although this scheme works quite well with large input signals and sufficient power supply voltages, it can not be used with low power supply voltages and signal levels due to the bias requirement of the two back to back diodes.

Hence a need exists for data shaping circuitry which overcomes the aforedescribed problems.

SUMMARY OF THE INVENTION

Accordingly, it is an object of the present invention to provide an improved data shaping circuit.

It is another object of the present invention to provide an improved integrated data shaping circuit.

Still another object of the present invention is to provide an improved data shaping circuit for use in a FSK receiver.

A still further object of the present invention is to provide a data shaping circuit that can be operated from a power supply of two volts or less.

In accordance with the above and other objects there is provided a data shaping circuit suited to be fabricated in integrated circuit form comprising an input to which is applied an alternating input signal and an output at which is provided a rectangular pulse, a first PN junction which is forward biased by the input signal during its positive half cycle, a second PN junction which is forward biased by the input signal during its negative half cycle and circuitry for comparing the current flows through the first and second PN junctions and producing the output pulse in response thereto.

A feature of the present invention is that the data shaping circuit is suited to be utilized in an integrated frequency shift keying receiver for providing square wave output data in response to input data being supplied thereto that may be distorted due to transmission losses.

One aspect of the present invention is that the data shaping circuit requires only one input terminal, as opposed to prior art data shaping circuits which require two input terminals, and can be operated from a lower power supply potential than the prior art.

BRIEF DESCRIPTION OF THE DRAWINGS

FIG. 1 is a schematic diagram illustrating a prior art data shaping comparator;

FIG. 2 illustrates waveforms useful for describing the operation of the prior art comparator of FIG. 1;

DETAILED DESCRIPTION OF THE PREFERRED EMBODIMENT

Figure 3:
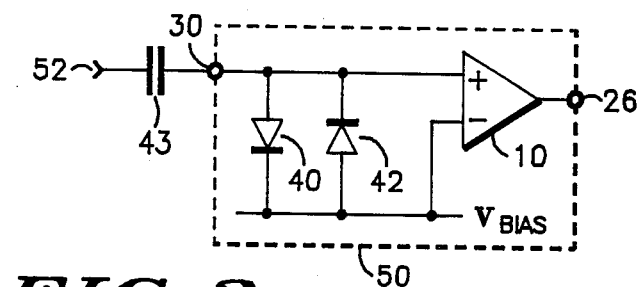
FIG. 3 is a schematic diagram illustrating one embodiment of the circuit of the present invention.

Turning to FIG. 1 there is shown "floating" comparator 10 of data shaping circuit 8 which is used in the aforementioned MC3356 wideband FSK receiver for data shaping. Comparator 10 includes differential amplifier 12 comprising NPN transistors 14 and 16 which have respective emitters differentially connected to current supply 18. The collectors of transistors 14 and 16 are coupled to differential-to-single ended converter circuit 20 which converts the differential currents flowing through the transistors to a single output current at output 22. Output 22 is connected to the base of NPN transistor 24 via inverter 23 and has its collector coupled to output 26 of data shaping circuit 10. The emitter of transistor 24, as well as current supply 18, is returned a source of negative or ground reference potential at terminal 28. Inputs 30 and 32 of differential amplifier 12 are respectively coupled to the base electrodes of transistors 14 and 16. Internal base current supplies 34 and 36 supply a current of $I_b$ to the bases of the respective transistors 14 and 16. Current supplies 34 and 36 are connected to positive supply rail 38, as is converter circuit 20, to receive an operating potential $V_{CC}$. Back to back clamping diodes 40 and 42 are connected across inputs 30 and 32. A decoupling capacitor 43 is connected between input 32 and ground reference.

Referring to FIG. 2, the operation of data shaping circuit 10 is now explained. In the following discussion it is assumed that the input signal applied to input 32 is positive with respect to the signal appearing at input 34 although it is recognized that the opposite can be true. Capacitor 43 provides a "floating" reference to follow any frequency shift in the input stage.

For large voltage excursions at input 30, waveform 44 of FIG. 2A, a voltage will be produced at input 32 that follows that at input 30 by one diode voltage, waveform 46 of FIG. 2B. Thus, between times $t_0$ and $t_1$, diode 40 is forward biased to charge capacitor 43 and the voltage at input 32 is less than the voltage at input 30 by the voltage drop across the diode. At $t_1$ the voltage at input 30 peaks and begins decreasing in amplitude such that capacitor 43 is no longer charging. The voltage level at input 32 will therefore remain constant through time $t_2$. At $t_2$ the voltage at input 30 has decreased and equals the voltage at input 32. Thereafter, the output of comparator 10 will switch output states. Prior to time $t_2$ transistor 14 is rendered conductive as its base is forward biased with respect to the base of transistor 16 such that the voltage at the collector of transistor 16 is high thereby turning off output transistor 24 via inverter 23. This produces a high output level state at output 26, waveform 48 of FIG. 2C. As the input signal at input 30 then falls below the voltage held at input 32 transistor 16 rises on and transistor 14 is rendered non-conductive. Thus the voltage level at the collector of transistor 16 falls causing output transistor 24 to turn on. The output of comparator 10 then switches from a high level state to a low level state. The voltage at input 32 will be held constant by capacitor 43 until the voltage at input 30 falls one diode voltage below the voltage at input 32 which allows capacitor 43 to then be discharged through diode 42. Hence, the voltage at input 32 will follow the input signal, but be one diode voltage higher in value, until the input signal reaches a peak in the negative direction, at time t₃. At this time the input signal begins increasing which stops the discharge of capacitor 43 as diode 42 becomes non-conductive. At t₄ the voltage at input 30 equals the voltage at input 32 (the threshold switching state of comparator 10) and as the input signal exceeds the voltage at input 32 the output of comparator 10 switches states. The output of comparator 10 is forced to switch level states a certain time interval after the input signal applied to input 30 changes direction. Thus, any bits of data which might be distorted during transmission are reshaped by data shaping circuit 10 and appear as data pulses at output 26.

The above described prior art data shaping circuit suffers from one disadvantage in that two input terminals are required for operation. It is desirable to eliminate the need for two inputs to data shaping circuit 10 in order to make an additional pinout available. Turning to FIG. 3, there is shown data shaping circuit 50 which eliminates the need for two input terminals. It is understood that components illustrated in FIG. 3, as well as subsequent FIG. 4, corresponding to like components of FIG. 1 are designated with the same reference numbers. The alternating input signal that is shaped in the manner described above is applied at input 52 from a resistive voltage source (not shown) to capacitor 43. Capacitor 43 has been placed in series with input 30 as opposed to input 32 as described above. Diodes 40 and 42 are now connected back to back between the inverting and non-inverting inputs of comparator 10 with the non-inverting input also being connected to a V$_{bias}$.

Provided that the input signal is at least two diode voltages in amplitude, data shaping circuit 50 operates in essentially the same manner as previously described with respect to data shaping circuit 8 to square up the alternating input signal applied thereto. Thus, as the alternating signal increases to a positive peak value diode 40 will charge capacitor 43. During this time the output of comparator 10 will be at a high or first level state. The output of comparator 10 will remain in this state until the input signal decreases to a diode voltage below its peak value at which time the output of comparator 10 will switch to a lower or second output level state. Thereafter comparator 10 remains in the second level state while capacitor 43 is discharged through diode 42 until the alternating signal has reached its negative peak value and begins increasing toward its positive peak value. At the point where the amplitude of the alternating signal is greater its negative by one diode voltage the comparator will again switch output states.

Although the above described data shaping circuits work quite well with sufficient power supply potential neither will work with a power supply voltage of less than two volts because of the bias voltage required due to the two clamping diodes.

Figure 4:
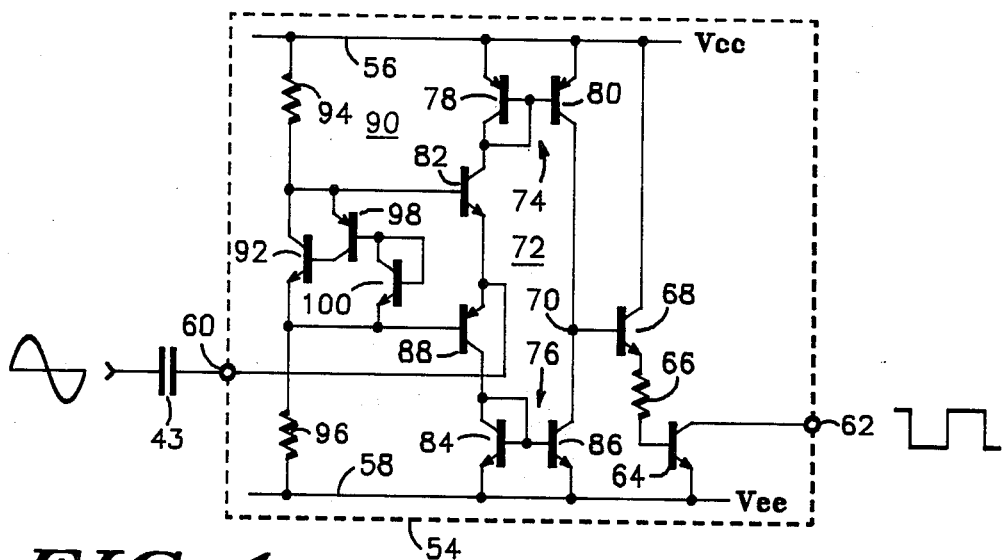
FIG. 4 is a simplified schematic diagram illustrating the preferred embodiment of the present invention.

Turning now to FIG. 4 there is illustrated data shaping circuit 54 of the present invention which overcomes the bias problems discussed above and which requires only a single input. Circuit 54 includes first and second power supply conductors 56 and 58 across which a power supply is connected. The data input signal is supplied to single input terminal 60. The output data pulses are provided at output 62, the collector of transistor 64. The emitter of transistor 64 is returned to conductor 58 while its base is coupled through resistor 66 to the emitter of NPN transistor 68. The collector of transistor 68 is returned to conductor 56 and its base is connected at node 70 to the output of current mirror circuitry 72. Current mirror circuity 72 comprises complementary current mirrors 74 and 76. Current mirror 74 includes PNP transistors 78 and 80 the bases of which are interconnected. The emitters of transistors 78 and 80 are connected to supply conductor 56 while the base of transistor 78 is connected both to its collector and the collector of transistor 82 while the collector of transistor 80 is connected to node 70. Current mirror 76 includes NPN transistors 84 and 86 the bases of which are interconnected and whose emitters are returned to supply conductor 58. The base of transistor 84 is connected both to its collector and the collector of PNP transistor 88. The collector of transistor 86 is connected to node 70. Transistors 82 and 88 are connected in series, having their emitters interconnected with input 60 and their respective collectors coupled to the inputs of current mirrors 74 and 76. A bias circuit 90 is used to bias transistors 82 and 88 in a quiescent state so that a high input impedance is provided at input 60. Bias circuit 90 includes, for illustration purposes, NPN transistor 92 having its collector-emitter conduction path coupled between power supply conductors 56 and 58 via resistors 94 and 96. The collector and emitter of transistor 92 are coupled respectively to the bases of transistor 82 and 88. PNP transistor 98 supplies base current drive to transistor 92, having its emitter and collector coupled between the collector and base of the latter. The base of transistor 98 is connected to the collector and base of diode connected transistor 100, the emitter of which is coupled to the base of transistor 88. It is realized that data shaping circuit 54 is suited to be fabricated in integrated circuit form.

The quiescent operating state of data shaping circuit 54 will now be explained. With no input alternating signal applied to capacitor 43 bias circuit 90 biases clamping diode/transistors 82 and 88 in a quiescent state to provide high impedance at input 60 while permitting operation of the circuit at a supply voltage of less than two volts. In order to provide the foregoing, bias circuit 90 ensures that sufficient current is available for clamping during normal operation of circuit 54 while minimizing the quiescent bias current flow through transistors 82 and 88. Transistors 98 and 100 supply a two diode voltage drop across the bases of transistors 82 and 88 and by setting a minimal current flow through the former the voltage developed between the bases of the latter will be insufficient to render the clamping transistors fully conductive. However, during normal operation the full current through transistor 92, which is beta times the magnitude of the quiescent current flowing through transistor 98, is available to clamping transistors 82 and 88.

In normal operation, with no input signal applied, the current flowing through transistors 82 and 88 are ideally equal and are mirrored equally by current mirrors 74 and 76 such that no excess current available to turn transistor 68 on. In this condition transistor 64 remains off wherein the output is at a first level state. As the alternating input signal applied to capacitor 43 becomes positive transistor 88 begins to conduct more than transistor 82 thereby clamping the capacitor. In this condition, current mirror 76 will have more current supplied to the input thereof than is supplied to the input of current mirror 74 and will want to sink a larger current at node 70 than is provided at the output of current mirror 74. Transistor 68 is maintained in an off condition since there is therefore no excess current available to the base thereof and the output remains in the first level state. When the input signal goes negative transistor 82 is rendered more conductive than transistor 88 wherein current mirror 74 provides more current to node 70 than is sank at the output of current mirror 76. Excess current is thus available to turn transistor 68 on thereby turning transistor 64 on. The output signal at output 62 thus switches to a second level state in response to transistor 64 being switched on. As described, transistors 82 and 88 in conjunction with current mirror 20 circuitry 72 and transistor 68 provide the combination of both clamping and comparison described above with reference to FIGS. 1 and 3.

Hence, what has been described above is novel data shaping circuit for reshaping digital data applied thereto that has become distorted during transmission. The data shaping circuit requires only one external input and in one feature of the invention can be operated at two volts supply.

I claim:

1. A data shaping circuit responsive to an alternating input signal supplied to an input thereof through a capacitive element for producing a rectangular output pulse at an output, comprising:

first circuit means responsive to the alternating signal for providing current drive, said first cirucit means including a first semiconductor PN junction having a first electrode coupled to the input which is forward biased by the alternating input signal during its positive half cycle to provide current flow therethrough and a second semiconductor PN junction having a first electrode coupled to the input which is forward biased by the alternating input signal during its negative half cycle to provide current flow therethrough;

means for providing biasing to said first and second semiconductor PN junctions in a quiescent operating state;

second circuit means coupled to said first and said second semiconductor PN junctions which is responsive to said currents flowing in said first and second semiconductor PN junctions for providing the output pulse, the output pulse being at a first level when said current flow in said first semiconductor PN junction is greater than said current flow in said second semiconductor PN junction and being at a second level when said current flow in said first semiconductor PN junction is less than said current flow in said second semiconducotr PN junction;

said first semiconductor PN junction is a first transistor the base-emitter path being coupled between a first output terminal of said bias circuit and the input of the data shaping circuit and its collector being coupled to said second circuit means; and said second semiconductor PN junction is a second transistor of opposite conductivity type from said first transistor the base-emitter path being coupled between a second output of said bias circuit and the input of the data shaping circuit and its collector being coupled to said second circuit means.

2. The circuit of claim 1 wherein said second circuit means includes:

current mirror circuitry responsive to current flowing in said first transistor for sourcing a proportional current to a first circuit node and being responsive to current flowing in said second transistor for sinking proportional current from said first circuit node; and switching circuit means having an input coupled to said first circuit node and an output coupled to the output of the data shaping circuit for producing the output pulse in response to said current mirror circuitry.

3. The circuit of claim 2 wherein said current mirror circuitry includes:

a first current mirror circuit having an input coupled to said collector of said first transistor and an output coupled to said first circuit node; and a second current mirror circuit having an input coupled to said collector of said second transistor and an output coupled to said first circuit node.

4. The circuit of claim 3 wherein said bias circuit includes:

a third transistor having an emitter, collector and base;

resistive means for coupling said collector and emitter of said third transistor between first and second power supply conductors; and means for supplying base current drive to said base of said third transistor.

5. The circuit of claim 4 wherein said means for supplying base current includes:

a fourth transistor having an emitter, collector and base, said emitter being coupled to said collector of said third transistor, said collector being coupled to said base of said third transistor; and a fifth transistor having an emitter, a collector and a base, said collector and base being coupled to said base of said fourth transistor and said emitter being coupled to said emitter of said third transistor.

6. The circuit of claim 4 wherein said means for supplying base current drive includes a fourth transistor the base and collector being coupled to said base of said third transistor and the emitter being coupled to said collector of said third transistor.

7. A data shaping circuit responsive to an alternating input signal supplied to an input thereof through a capacitive element for producing a rectangular output pulse at an output, comprising:

first circuit responsive to the alternating signal for providing current drive, said first circuit means including a first semiconductor PN junction having a first electrode coupled to the input which is forward biased by the alternating input signal during its positive half cycle to provide current flow therethrough and a second semiconductor PN junction having a first electrode coupled to the input which is forward biased by the alternating input signal during its negative half cycle to provide current flow therethrough;

means for providing biasing to said first and second semiconductor PN junctions in a quiescent operating state;

second circuit means coupled to said first and said second semiconductor PN junctions which is responsive to said currents flowing in said first and second semiconductor PN junctions for providing the output pulse, the output pulse being at a first level when said current flow in said first semiconductor PN junction is greater than said current flow in said second semiconductor PN junction and being at a second level when said current flow in said first PN junction is less than said current flow in said second semiconductor PN junction;

said second circuit means includes a comparator having a first input coupled to the input of the circuit, and second input coupled to said source of biasing potential and an output coupled to the output of the circuit.

8. The circuit of claim 7 wherein said first semiconductor PN junction is a first diode having an anode coupled to the input of the circuit and a cathode coupled to said source of bias potential and said second semiconductor PN junction is a second diode having an anode coupled to said source of bias potential and a cathode coupled to the input of the circuit.

* * * * *